US012682952B2

(12) United States Patent
Doluca et al.

(10) Patent No.: US 12,682,952 B2
(45) Date of Patent: Jul. 14, 2026

(54) CONTENT-ADDRESSABLE MEMORY (CAM) CELL WITH P AND N PASS GATES TO SAME WRITE BIT LINE

(71) Applicant: Aril Computer Corporation, Los Altos, CA (US)

(72) Inventors: Sinan Doluca, Saratoga, CA (US); Thomas Riordan, Los Altos, CA (US)

(73) Assignee: Aril Computer Corporation, Los Altos, CA (US)

( * ) Notice: Subject to any disclaimer, the term of this patent is extended or adjusted under 35 U.S.C. 154(b) by 76 days.

(21) Appl. No.: 18/780,884

(22) Filed: Jul. 23, 2024

(65) Prior Publication Data

US 2026/0031145 A1     Jan. 29, 2026

(51) Int. Cl.
| | |
|---|---|
| *G11C 15/04* | (2006.01) |
| *G11C 11/412* | (2006.01) |
| *G11C 11/419* | (2006.01) |

(52) U.S. Cl.
CPC ............ *G11C 15/04* (2013.01); *G11C 11/412* (2013.01); *G11C 11/419* (2013.01)

(58) Field of Classification Search
CPC ...... G11C 15/04; G11C 11/412; G11C 11/419
See application file for complete search history.

(56) References Cited

U.S. PATENT DOCUMENTS

| | | | | |
|---|---|---|---|---|
| 5,828,597 A | * | 10/1998 | Madan | G11C 11/412 365/174 |
| 6,421,265 B1 | * | 7/2002 | Lien | G11C 15/043 365/189.05 |
| 6,496,399 B1 | | 12/2002 | Choi et al. | |
| 6,646,900 B2 | | 11/2003 | Tsuda | |
| 7,019,999 B1 | * | 3/2006 | Srinivasan | G11C 15/04 365/49.1 |
| 7,433,217 B1 | | 10/2008 | Maheshwarl | |
| 7,606,062 B2 | | 10/2009 | Hsu et al. | |
| 7,944,724 B2 | | 5/2011 | Chu | |
| 8,462,532 B1 | | 6/2013 | Argyres | |
| 9,620,214 B2 | | 4/2017 | Watanabe et al. | |
| 10,910,056 B2 | | 2/2021 | Yabuuchi | |
| 11,170,844 B1 | * | 11/2021 | Doluca | H10B 10/12 |
| 11,600,326 B2 | | 3/2023 | Schreck et al. | |
| 11,837,289 B2 | | 12/2023 | Ramamurthy et al. | |

(Continued)

*Primary Examiner* — Khamdan N. Alrobaie

(74) *Attorney, Agent, or Firm* — gPatent LLC; Stuart T. Auvinen

(57) ABSTRACT

A Content-Addressable Memory (CAM) cell has a latch of cross-coupled inverters and transmission gates to bit lines. Each transmission gate has n-channel and p-channel transistors in parallel that both turn on during writing. A node in the latch is applied to a gate of a data transistor in series with a select transistor to discharge a match line when select and latch data mismatch. Second data and select transistors receive inverse data from the latch for a CAM but receive data from a second cell latch for a Ternary Content-Addressable Memory (TCAM) cell with two latches per pair of select lines. When mismatches occur, even cells discharge the match line using n-channel data and select transistors while odd cells charge a complement match line using p-channel data and select transistors. The total number of p-channel and n-channel transistors in the cell can be equal when using complementary match lines.

3 Claims, 12 Drawing Sheets

90

(56)  References Cited

U.S. PATENT DOCUMENTS

| | | | |
|---|---|---|---|
| 2002/0126519 A1* | 9/2002 | Foss ........................ | G11C 15/04 |
| | | | 365/49.17 |
| 2012/0026818 A1 | 2/2012 | Chen et al. | |
| 2012/0228714 A1* | 9/2012 | Lim ......................... | G11C 8/16 |
| | | | 257/E27.098 |
| 2012/0327696 A1* | 12/2012 | Argyres ................. | G11C 15/04 |
| | | | 365/49.17 |
| 2023/0197154 A1* | 6/2023 | Chen ...................... | G11C 15/04 |
| | | | 365/49.11 |
| 2024/0055048 A1 | 2/2024 | Sinangil et al. | |
| 2024/0257867 A1 | 8/2024 | You et al. | |
| 2024/0282364 A1* | 8/2024 | You ......................... | H03K 19/20 |
| 2025/0316306 A1 | 10/2025 | You et al. | |
| 2025/0364040 A1* | 11/2025 | Doluca ................. | G11C 5/063 |

* cited by examiner

| D | DB | SL | SLB | ML | MATCH |
|---|----|----|-----|----|-------|
| 0 | 1  | 0  | 1   | 1  | 1     |
| 1 | 0  | 0  | 1   | 0  | 0     |
| 0 | 1  | 1  | 0   | 0  | 0     |
| 1 | 0  | 1  | 0   | 1  | 1     |

Fig. 3

| DE | DEB | SLE | SLEB | ML | DO | DOB | SLO | SLOB | MLB | MATCH |
|----|-----|-----|------|----|----|-----|-----|------|-----|-------|
| 0 | 1 | 0 | 1 | 1 | 0 | 1 | 0 | 1 | 0 | 1 |
| 1 | 0 | 0 | 1 | 0 | 0 | 1 | 0 | 1 | 0 | 0 |
| 0 | 1 | 1 | 0 | 0 | 0 | 1 | 0 | 1 | 0 | 0 |
| 1 | 0 | 1 | 0 | 1 | 0 | 0 | 0 | 1 | 0 | 1 |
| 0 | 1 | 0 | 1 | 1 | 1 | 0 | 0 | 1 | 1 | 0 |
| 1 | 0 | 0 | 1 | 0 | 1 | 0 | 0 | 1 | 1 | 0 |
| 0 | 1 | 1 | 0 | 0 | 1 | 0 | 0 | 0 | 1 | 0 |
| 1 | 0 | 1 | 0 | 1 | 0 | 1 | 1 | 0 | 1 | 0 |
| 0 | 1 | 0 | 1 | 0 | 0 | 1 | 1 | 0 | 1 | 0 |
| 1 | 0 | 0 | 1 | 0 | 0 | 1 | 1 | 0 | 1 | 0 |
| 0 | 1 | 1 | 0 | 1 | 1 | 0 | 1 | 0 | 0 | 0 |
| 1 | 0 | 1 | 0 | 0 | 1 | 0 | 1 | 0 | 0 | 1 |
| 0 | 1 | 0 | 1 | 1 | 1 | 0 | 1 | 0 | 0 | 0 |
| 1 | 0 | 0 | 1 | 0 | 1 | 0 | 1 | 0 | 0 | 0 |
| 1 | 0 | 1 | 1 | 1 | 1 | 0 | 1 | 0 | 0 | 1 |

Fig. 6

| FE | FEB | TE | TEB | SLE | SLEB | ML | FO | FOB | TO | TOB | SLO | SLOB | MLB | MATCH |
|----|-----|----|-----|-----|------|------|----|-----|----|-----|-----|------|---------|---------|
| 0 | 1 | 0 | 1 | X | X | Invalid | 0 | 1 | 0 | 1 | X | X | Invalid | Invalid |
| 1 | 0 | 0 | 1 | 0 | 1 | 1 | 0 | 1 | 0 | 1 | X | X | Invalid | Invalid |
| 0 | 1 | 1 | 0 | 0 | 1 | 0 | 0 | 1 | 0 | 1 | X | X | Invalid | Invalid |
| 1 | 0 | 1 | 0 | X | X | Masked | 0 | 1 | 0 | 1 | X | X | Invalid | Invalid |
| 0 | 1 | 0 | 1 | X | X | Invalid | 0 | 1 | 0 | 1 | X | X | Invalid | Invalid |
| 1 | 0 | 0 | 1 | 1 | 0 | 0 | 0 | 1 | 0 | 1 | X | X | Invalid | Invalid |
| 0 | 1 | 1 | 0 | 1 | 0 | 1 | 0 | 1 | 0 | 1 | X | X | Invalid | Invalid |
| 1 | 0 | 1 | 0 | X | X | Masked | 0 | 1 | 0 | 1 | X | X | Invalid | Invalid |
| 0 | 1 | 0 | 1 | X | X | Invalid | 1 | 0 | 0 | 1 | 0 | 1 | 0 | Invalid |
| 1 | 0 | 0 | 1 | 0 | 1 | 1 | 1 | 0 | 0 | 1 | 0 | 1 | 0 | 1 |
| 0 | 1 | 1 | 0 | 0 | 1 | 0 | 1 | 0 | 0 | 1 | 0 | 1 | 0 | 0 |
| 1 | 0 | 1 | 0 | X | X | Masked | 1 | 0 | 0 | 1 | 0 | 1 | 0 | 1 |
| 0 | 1 | 0 | 1 | X | X | Invalid | 1 | 0 | 0 | 1 | 0 | 1 | 0 | Invalid |
| 1 | 0 | 0 | 1 | 1 | 0 | 0 | 1 | 0 | 0 | 1 | 0 | 1 | 0 | 0 |
| 0 | 1 | 1 | 0 | 1 | 0 | 1 | 1 | 0 | 0 | 1 | 0 | 1 | 0 | 1 |
| 1 | 0 | 1 | 0 | X | X | Masked | 1 | 0 | 0 | 1 | 0 | 1 | 0 | 1 |
| 0 | 1 | 0 | 1 | X | X | Invalid | 1 | 0 | 0 | 1 | 1 | 0 | 1 | Invalid |
| 1 | 0 | 0 | 1 | 0 | 1 | 1 | 1 | 0 | 0 | 1 | 1 | 0 | 1 | 0 |
| 0 | 1 | 1 | 0 | 0 | 1 | 0 | 1 | 0 | 0 | 1 | 1 | 0 | 1 | 0 |
| 1 | 0 | 1 | 0 | X | X | Masked | 1 | 0 | 0 | 1 | 1 | 0 | 1 | 0 |
| 0 | 1 | 0 | 1 | X | X | Invalid | 1 | 0 | 0 | 1 | 1 | 0 | 1 | Invalid |
| 1 | 0 | 0 | 1 | 1 | 0 | 0 | 1 | 0 | 0 | 1 | 1 | 0 | 1 | 0 |
| 0 | 1 | 1 | 0 | 1 | 0 | 1 | 1 | 0 | 0 | 1 | 1 | 0 | 1 | 0 |
| 1 | 0 | 1 | 0 | X | X | Masked | 1 | 0 | 0 | 1 | 1 | 0 | 1 | 0 |

Fig. 11A

| FE | FEB | TE | TEB | SLE | SLEB | ML | FO | FOB | TO | TOB | SLO | SLOB | MLB | MATCH |
|----|-----|----|-----|-----|------|----|----|-----|----|-----|-----|------|-----|-------|
| 0 | 1 | 0 | 1 | X | X | Invalid | 0 | 1 | 1 | 0 | 0 | 1 | 1 | Invalid |
| 1 | 0 | 0 | 1 | 0 | 1 | 1 | 0 | 1 | 1 | 0 | 0 | 1 | 1 | 0 |
| 0 | 1 | 1 | 0 | 0 | 1 | 0 | 0 | 1 | 1 | 0 | 0 | 1 | 1 | 0 |
| 1 | 0 | 1 | 0 | X | X | Masked | 0 | 1 | 1 | 0 | 0 | 1 | 1 | 0 |
| 0 | 1 | 0 | 1 | X | X | Invalid | 0 | 1 | 1 | 0 | 0 | 1 | 1 | Invalid |
| 1 | 0 | 0 | 1 | 1 | 0 | 0 | 0 | 1 | 1 | 0 | 0 | 1 | 1 | 0 |
| 0 | 1 | 1 | 0 | 1 | 0 | 1 | 0 | 1 | 1 | 0 | 0 | 1 | 1 | 0 |
| 1 | 0 | 1 | 0 | X | X | Masked | 0 | 1 | 1 | 0 | 0 | 1 | 1 | 0 |
| 0 | 1 | 0 | 1 | X | X | Invalid | 0 | 1 | 1 | 0 | 1 | 0 | 0 | Invalid |
| 1 | 0 | 0 | 1 | 0 | 1 | 1 | 0 | 1 | 1 | 0 | 1 | 0 | 0 | 1 |
| 0 | 1 | 1 | 0 | 0 | 1 | 0 | 0 | 1 | 1 | 0 | 1 | 0 | 0 | 0 |
| 1 | 0 | 1 | 0 | X | X | Masked | 0 | 1 | 1 | 0 | 1 | 0 | 0 | 1 |
| 0 | 1 | 0 | 1 | X | X | Invalid | 0 | 1 | 1 | 0 | 1 | 0 | 0 | Invalid |
| 1 | 0 | 0 | 1 | 1 | 0 | 0 | 0 | 1 | 1 | 0 | 1 | 0 | 0 | 0 |
| 0 | 1 | 1 | 0 | 1 | 0 | 1 | 0 | 1 | 1 | 0 | 1 | 0 | 0 | 1 |
| 1 | 0 | 1 | 0 | X | X | Masked | 0 | 1 | 1 | 0 | 1 | 0 | 0 | 1 |
| 0 | 1 | 0 | 1 | X | X | Invalid | 1 | 0 | 1 | 0 | X | X | Masked | Invalid |
| 1 | 0 | 0 | 1 | 0 | 1 | 1 | 1 | 0 | 1 | 0 | X | X | Masked | 1 |
| 0 | 1 | 1 | 0 | 0 | 1 | 0 | 1 | 0 | 1 | 0 | X | X | Masked | 0 |
| 1 | 0 | 1 | 0 | X | X | Masked | 1 | 0 | 1 | 0 | X | X | Masked | 1 |
| 0 | 1 | 0 | 1 | X | X | Invalid | 1 | 0 | 1 | 0 | X | X | Masked | Invalid |
| 1 | 0 | 0 | 1 | 1 | 0 | 0 | 1 | 0 | 1 | 0 | X | X | Masked | 0 |
| 0 | 1 | 1 | 0 | 1 | 0 | 1 | 1 | 0 | 1 | 0 | X | X | Masked | 1 |
| 1 | 0 | 1 | 0 | X | X | Masked | 1 | 0 | 1 | 0 | X | X | Masked | 1 |

Fig. 11B

CONTENT-ADDRESSABLE MEMORY (CAM) CELL WITH P AND N PASS GATES TO SAME WRITE BIT LINE

FIELD OF THE INVENTION

This invention relates to Content-Addressable Memory (CAM), and more particularly to a CAM cell written through parallel n-channel and p-channel transistors.

BACKGROUND OF THE INVENTION

Semiconductor memories such as Static Random-Access Memory (SRAM) and Content-Addressable Memory (CAM) scale their supply voltages as cell transistors shrink in size with improving semiconductor processing technologies.

Sealing of supply voltage has been possible in advanced node Complementary Metal-Oxide-Semiconductor (CMOS) Fin Field-Effect Transistor (FinFET) processes by trading off performance and clock frequency against power consumption. Dynamic voltage scaling and frequency scaling can be used to optimize performance and power consumption.

Supply-voltage scaling problems can occur due to read signal margin and write signal margin requirements. To improve these margin requirements, some semiconductor foundries require a higher memory supply voltage (VDDM) to SRAM building blocks than the supply voltage (VDD) to other logic.

SRAMs and CAMs are sometimes available as a macro cell in a standard cell or similar design library. Ideally, the CAM should use the same supply voltage (VDD) as the logic cells in the macro library. Additional voltage conversion circuits are needed when the CAM has a different supply voltage. These additional voltage conversion circuits are undesirable.

In some cases, designers have chosen to use latches with buffered read access ports to design Ultra-Low-Voltage (ULV) SRAM macros. The tradeoff is that layout area is compromised for voltage scaling capability.

A traditional 6-transistor (6T) SRAM cell has a shared read/write port that uses the same pass transistors and bit lines for both reading and writing. Two select lines can be added to each column to control select n-channel transistors to a match line for the row. When the cell data mis-matches the select data the match line is driven low using the select transistors and two n-channel transistors having gates controlled by the SRAM latch. Thus a CAM cell can be constructed from 10 transistors. This 10T CAM cell can have 2 p-channel transistors and 8 n-channel transistors.

This CAM cell is very NMOS dominant with 8 NMOS and 2 PMOS devices. This imbalance leads to a less-than-optimum footprint in layout area. Voltage scaling may be limited due to writability of the cell at low voltages.

Not all CAM cell structures are a good fit for the transistor layout footprint used by standard cell or macro libraries. These library cells are optimized for logic cells. Logic cells tend to have an equal number of p-channel (PMOS) and n-channel (NMOS) transistors. Thus the area in the layout that is allocated for macro cells tend to allow for an equal number of NMOS and PMOS transistors. When a standard all-NMOS 10T CAM cell is used, with 8 NMOS and 2 PMOS transistors, most of the area reserved for PMOS can be wasted.

Ternary Content-Addressable Memory (TCAM) stores two bits per TCAM cell. Each TCAM cell can store a binary 1, a binary 0, or a don't care (X). The fourth possible state of the 2 bits can be defined as invalid. When the TCAM cell state is X, then the select matching is disabled for that TCAM cell. This allows for masked comparisons that can be very useful for applications such as address lookup for routers and networks.

CAM and TCAM cells used for such search engines are not only much larger than SRAM cells, but also suffer from ground bounce noise. Search operations often require that the entire memory be accessed and compared to find one or more rows that store the searched-for data. When the entire array of CAM or TCAM cells is accessed, a large current can be drawn, creating noise problems.

The ground bounce can be very large due to almost all CAM cells in one row (accept the matching address) discharging in one compare cycle causing a massive current spike to ground (VSS). Similarly during the precharge cycle, all discharged match lines will be precharged to power (VDD) causing a similar supply rail (VDD) droop. These two current spikes are asymmetric and with clock phases that can cause oscillations in the VDD/VSS lines due to inherent parasitic Resistor-Inductor-Capacitor (RLC) networks that are associated with VDD and VSS networks.

What is desired is a CAM cell or a TCAM cell that has reduced ground and supply bounce and that is optimized for standard cell macro libraries. A CAM/TCAM cell with an equal number of PMOS and NMOS transistors is desired to reduce supply noise and to better fit into the layout of logic cells in a standard cell library. A balanced PMOS/NMOS TCAM/CAM cell that can operate at ultra-low supply voltages is desirable. A TCAM/CAM cell with both NMOS and PMOS pass transistors to the read/write bit lines is desired to allow for full CMOS complimentary writing into the cell, even at very low voltages. A balanced PMOS/NMOS TCAM/CAM cell that does not require external read or write assist circuitry is desired.

BRIEF DESCRIPTION OF THE DRAWINGS

FIG. 3 shows a truth table for the CAM cell of FIG. 1.

FIG. 6 shows a truth table for the CAM double cell of FIG. 4.

FIGS. 11A-11B show a truth table for the TCAM double cell of FIG. 9.

DETAILED DESCRIPTION

The present invention relates to an improvement in CAM and TCAM cells. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
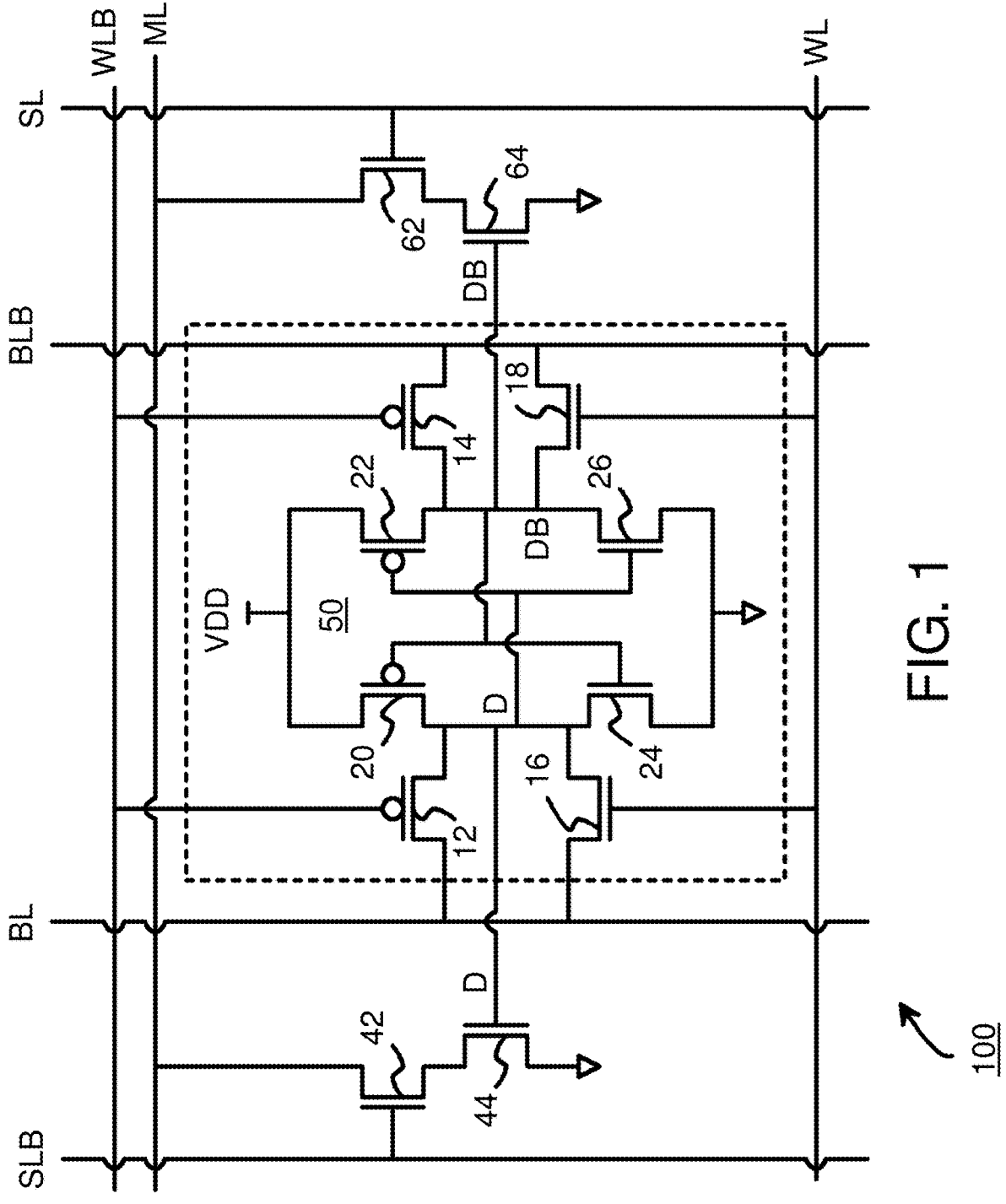
FIG. 1 is a diagram of a CAM cell with both P and N transistors in parallel to read/write bit lines.

FIG. 1 is a diagram of a CAM cell with both P and N transistors in parallel to read/write bit lines. Cell 100 stores one bit of data D in latch 50 created by cross-coupled inverters.

Cell 100 is written when the row is selected by Word Line (WL) being high and WLB being low. WLB is the inverse of WL. WL high turns on n-channel pass transistors 16, 18 and WLB low turns on p-channel pass transistors 12, 14, so all four pass transistors are turned on when writing. The input data on write bit line BL drives through both n-channel pass transistor 16 and p-channel pass transistor 12 to node D in cell latch 50, while inverse input data on write bit line BLB drives through another pair of n-channel pass transistor 18 and p-channel pass transistor 14 to inverse node DB in cell latch 50. Thus cell latch 50 is written by differential data through two very low impedance transmission gates. This allows for a fast write even when ultra-low power-supply voltages are used. Cell write margin is very good.

Cell latch 50 can be read in a similar manner to writing, except that BL, BLB are externally precharged and equalized before reading. During reading either BL or BLB is pulled low by cell latch 50. A sense amplifier can sense a small voltage change on BL or BLB caused by the cell read.

In cell latch 50, the drains of p-channel transistor 20 and n-channel transistor 24 are connected together at data node D and to the gates of p-channel transistor 22 and n-channel transistor 26, which have their drains connected together and to the gates of p-channel transistor 20 and n-channel transistor 24, forming a pair of cross-coupled inverters. The drains of transistors 22, 26 drive the inverse data node DB of cell latch 50. The sources of n-channel transistors 24, 26 connect to ground, while the sources of p-channel transistors 20, 22 connect to the power supply VDD. VDD is the same ultra-low voltage supply used by the logic gates and macros in a standard cell design.

As with a traditional 6T SRAM cell, only a single pair of bit lines BL, BLB, connect to write-only RAM cell 100. However, full transmission gates are provided to connect the cell latch to the write bit lines BL, BLB.

During a write operation, word line WLB drives the gates of p-channel pass transistors 12, 14 low, allowing bit line BL to drive the drains of transistors 20, 24 through p-channel pass transistor 12, and allowing complementary bit line BLB to drive the drains of transistors 22, 26 through p-channel pass transistor 14, thus writing data into cell 100.

To improve the write margin, both P and N pass transistors are turned on for a write, so that p-channel pass transistor 12 and n-channel pass transistor 16 act as a transmission gate between the cell latch and bit line BL. Likewise, p-channel pass transistor 14 and n-channel pass transistor 18 act as a transmission gate to BLB.

During a write, word line WL is activated by driving it high, and inverse word line WLB is also activated by driving it low, so that all pass transistors 12, 14, 16, 18 are turned on.

During a compare operation, the compare data S is applied to the select line SL, and the inverse of S is applied to inverse select line SLB. Any mismatch of select data S with cell data D pulls the match line ML low for the whole row of cells.

Data node D from cell latch 50 in CAM cell 100 is applied to the gate of n-channel transistor 44, which drives match line ML low through select n-channel transistor 42 when inverse select line SLB is high and D is high. Thus D=1 and S=0 pulls ML low to indicate a mismatch.

The inverse data node DB from cell latch 50 in CAM cell 100 is applied to the gate of n-channel transistor 64, which drives match line ML low through select n-channel transistor 62 when select line SL is high and DB is high. Thus D=0 and S=1 pulls ML low to indicate a mismatch.

When a match occurs, ML will remain high. When D=0 and S=0, then transistor 44 is turned off by D, preventing select transistor 42 from discharging ML. SL=0 turns off select transistor 62, preventing transistor 64 from discharging ML.

When D=1 and S=1, then transistor 44 is turned on by D, but select transistor 42 is turned off by SLB, blocking discharge of ML. SL=1 turns on select transistor 62, but DB=0 turns off transistor 64 to prevent discharging ML.

Figure 2:
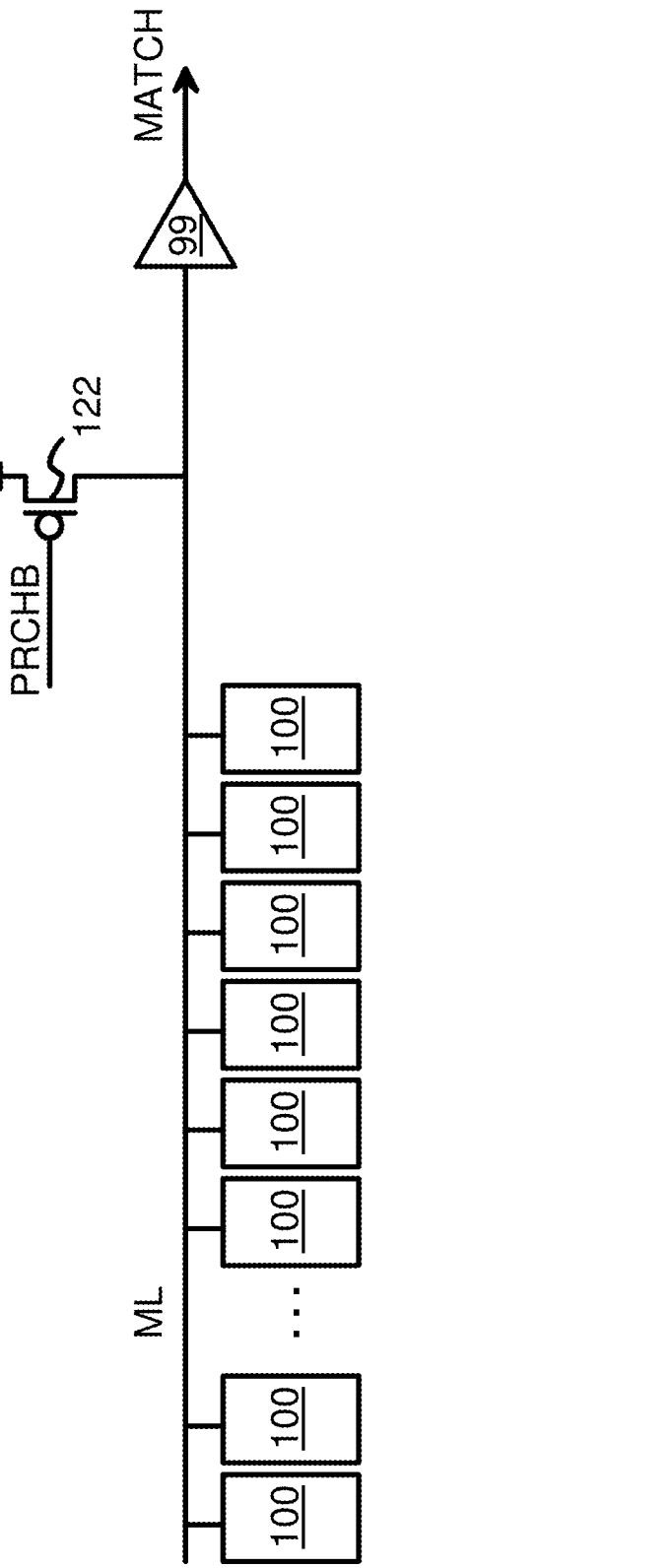
FIG. 2 shows a row of CAM cells.

FIG. 2 shows a row of CAM cells. A row of CAM cells 100 share the same write lines WL, WLB and match line ML. Match line ML is precharged high by p-channel precharge transistor 122 when PRCHB is low before a compare operation. During the compare, PRCHB is driven high, allowing ML to float.

When all the CAM cells 100 in a row match their select line data, then match line ML is not discharged and remains high. Driver 99 then drives match signal MATCH high to indicate that a match was found for this row. The CAM array can report the row address for this matching row, or the data from this row can be read out and returned to the search engine.

When any of CAM cells 100 mis-matches the applied select data for that column, then that CAM cell 100 drives ML low. Driver 99 then drives match signal MATCH low to indicate that a match was not found for this row.

FIG. 3 shows a truth table for the CAM cell of FIG. 1. In the first row of the truth table, D=0, SL=0, a match occurs since cell data D matches select line data SL. Match line ML is not pulled low, so ML and MATCH are high.

In the second row of the truth table, D=1, SL-0, a mis-match occurs since cell data D does not match select line data SL. Match line ML is pulled low, so ML and MATCH are low. Likewise in row three, D=0, SL=1, the mismatch pulls ML low.

In the last row of the truth table, D=1, SL=1, a match occurs since cell data D matches select line data SL. Match line ML is not pulled low, so ML and MATCH are high.

CAM cell 100 of FIG. 1 is a 12T cell with 4 p-channel transistors and 8 n-channel transistors. Cell 100 does not have a 50:50 PMOS:NMOS ratio. Also, during compare operations, all of cells 100 in the row turn on at the same time and pull down ML when mismatches occur. This can cause VSS bounce and supply droop. Conversely a VDD droop can occur during a ML precharge operation. Also, the capacitance of the ML line can be large, slowing compare speed.

Figure 4:
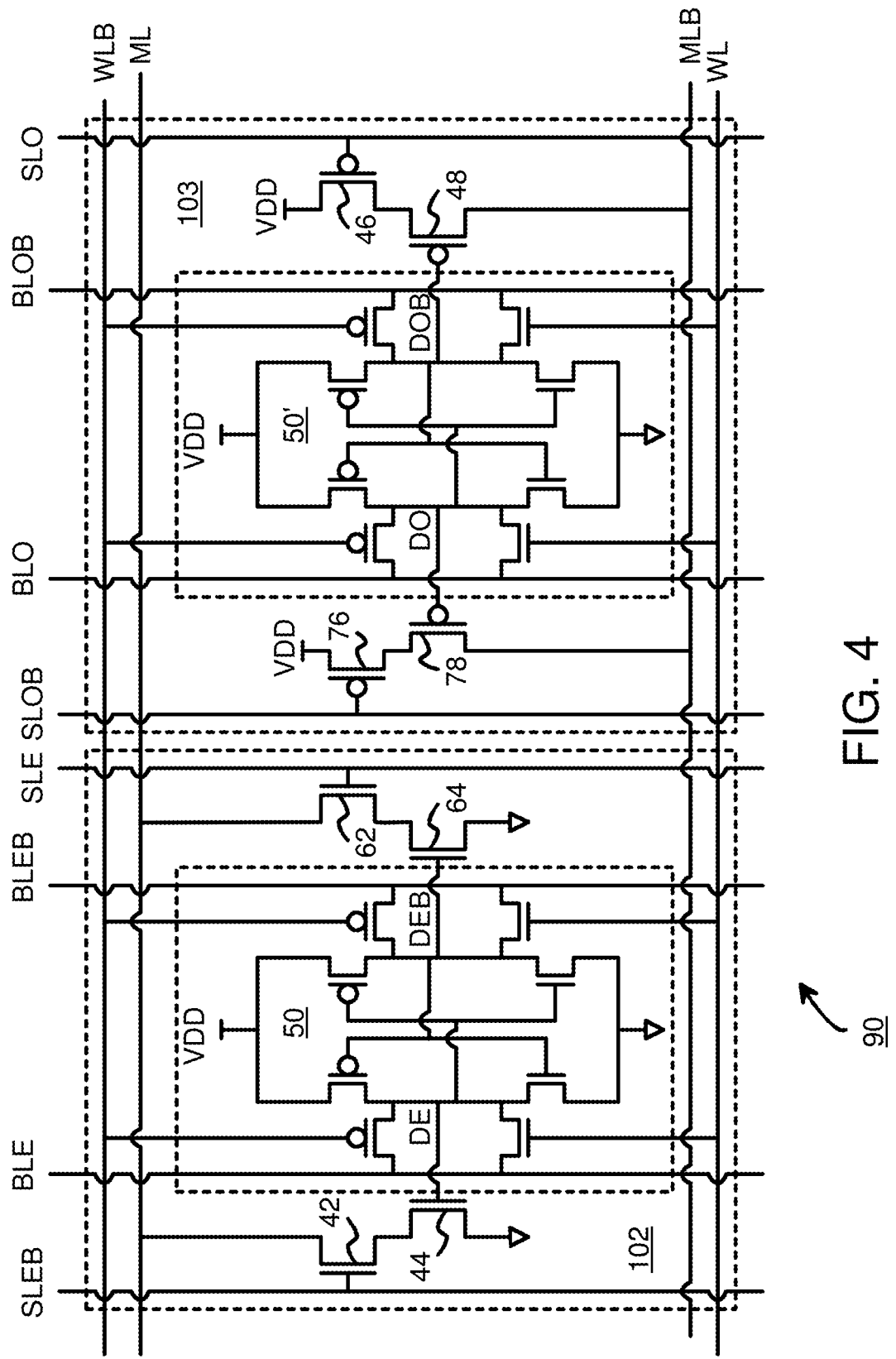
FIG. 4 is a schematic of a double CAM cell with complementary match lines.

The inventor overcomes these shortcomings of CAM cell 100 of FIG. 1 with a complementary match line architecture. FIG. 4 is a schematic of a double CAM cell with complementary match lines. CAM double cell 90 includes even cell 102 that stores data bit DE in even latch 50, and odd cell 103 that stores data bit DO in odd latch 50'.

CAM double cell 90 stores two independent data bits: DE in even latch 50 and DO in odd latch 50'. DE and DO are separate binary bits that do not have any restrictions on each other. DE and DO may be bits in a network address that is being stored in a row in an array of CAM double cell 90. Each CAM double cell 90 replaces two of CAM cell 100.

Even cell 102 is the same as CAM cell 100 (FIG. 1), with latch 50 having cross-coupled inverters of p-channel transistors 20, 22 and n-channel transistors 24, 26, and n-channel pass transistors 16, 18 and p-channel pass transistors 12, 14 as shown in FIG. 1. Even cell 102 drives match line ML low through n-channel transistors 42, 44 or through n-channel transistors 62, 64 when even data DE and even select line SLE mismatch. When DE is high and SLEB is high, n-channel transistors 42, 44 both turn on to discharge ML. When DEB is high and SLE is high, n-channel transistors 62, 64 both turn on to discharge ML. When DE and SLE are both high, or both low, then ML remains high.

Odd cell 103 also has latch 50' that is identical to latch 50 of FIG. 1, with cross-coupled inverters of p-channel transistors 20, 22 and n-channel transistors 24, 26, and n-channel pass transistors 16, 18 and p-channel pass transistors 12, 14. However, the pass transistors in odd latch 50' connect to odd bit line BLO and complement odd bit line BLOB. The same row word line WL and complement word line WLB are used for both even cell 102 and odd cell 103 in the same row.

While even cell 102 connects to match line ML, odd cell 103 connects to complement match line MLB. While ML is precharged high, MLB is precharged low. When a mismatch occurs, even cell 102 drives ML low, but odd cell 103 drives MLB high.

Odd cell 103 drives complement match line MLB high through p-channel transistors 76, 78 or through p-channel transistors 46, 48 when odd data DO and odd select line SLO mismatch. When DO is low and SLOB is low, p-channel transistors 76, 78 both turn on to charge MLB high. When DOB is low and SLO is low, p-channel transistors 46, 48 both turn on to charge MLB high. When DO and SLO are both high, p-channel transistors 78, 46 both turn off, floating MLB to indicate a match for this bit. When DOB and SLOB are both high, p-channel transistors 48, 76 both turn off, floating MLB to indicate a match for this bit.

Figure 5:
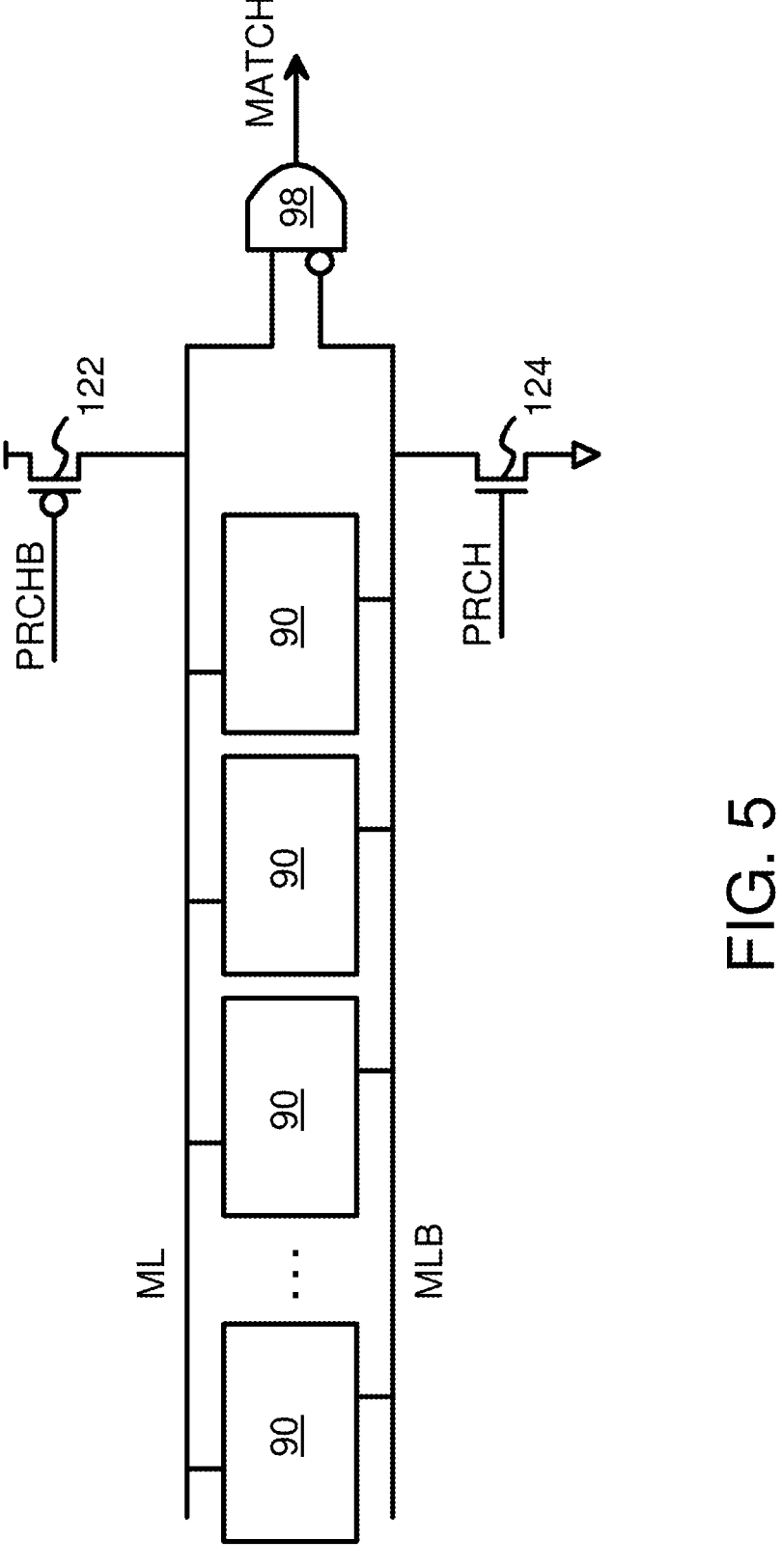
FIG. 5 shows a row of CAM double cells.

FIG. 5 shows a row of CAM double cells. A row of CAM double cells 90 share the same write lines WL, WLB. Inside each CAM double cell 90, even cell 102 connects to match line ML while odd cell 103 connects to complement match line MLB.

Match line ML is precharged high by p-channel precharge transistor 122 when PRCHB is low before a compare operation. During the compare, PRCHB is driven high, turning off p-channel precharge transistor 122, allowing ML to float with a high initial state.

Complement match line MLB is precharged low by n-channel precharge transistor 124 when PRCH is high before a compare operation. During the compare, PRCH is driven low, turning off n-channel precharge transistor 124, allowing MLB to float with a low initial state.

When all the CAM double cells 90 in a row have their even cell 102 match their even select line data, then match line ML is not discharged and remains high. A logic one is applied to the upper input of gate 98. When all the CAM double cells 90 in a row have their odd cell 103 match their odd select line data, then complement match line MLB is not charged and remains low. A logic zero is applied to the lower input of gate 98. When ML remains high and MLB remains low, gate 98 drives match signal MATCH high to indicate that a match was found for this row. The CAM array can report the row address for this matching row, or the data from this row can be read out and returned to the search engine.

When any of CAM double cell 90 has an even cell 102 that mis-matches the applied even select data for that column, then that CAM double cell 90 drives ML low. Gate 98 then drives match signal MATCH low to indicate that a match was not found for this row. When any of CAM double cell 90 has an odd cell 103 that mis-matches the applied odd select data for that column, then that CAM double cell 90 drives MLB high. Gate 98 then drives match signal MATCH low to indicate that a match was not found for this row. Thus both even and odd cells in the entire row must match all select bits applied to the row for a final MATCH to be signaled.

FIG. 6 shows a truth table for the CAM double cell of FIG. 4. DEB is the inverse of even bit DE stored in even cell 102, and DOB is the inverse of odd bit DO stored in odd cell 103. SLEB is the inverse of SLE, which is the even select line applied to a column of even cells 102. SLOB is the inverse of SLO, which is the odd select line applied to a column of odd cells 103.

There are 16 possible combinations of DE, DO, SE, SO. DE changes for each row in the truth table, SLE changed for every 2 rows, DO changes for every 4 rows, and SLO changes for every 8 rows in the truth table. These are the logical inputs of the truth table.

Match line ML is high (1) when DE matches SE, and low (0) when DE mismatches SE. ML is 1 for the first row, 0 for the second and third rows, and 1 for the fourth rows. Then this 1001 pattern repeats for the other rows in the truth table.

Complement match line MLB is high (1) when DO mismatches SO, and low (0) when DO matches SO. MLB is 0 for the first four rows, when DO=SLO-0, and for the last four rows, when DO=SO=1, indicating a match. MLB is 1 to indicate a mismatch for the middle 8 rows.

MATCH is driven high for a double match, when ML is high and MLB is low. This occurs for the first row, where DE=SLE=0 and DO=SLO=0. A double match also occurs for the fourth row, where DE=SLE=1 and DO=SLO=0. Double matches also occur for the last row, where DE=SLE=0 and DO=SLO=1, and for the fourth from the last row, where DE=SLE=1 and DO=SLO=1.

CAM double cell 90 of FIG. 4 is a 24T cell with 12 p-channel transistors and 12 n-channel transistors. CAM double cell 90 has a 50:50 PMOS:NMOS ratio, which is ideal for efficient layout in macro cell libraries. During compare operations, when mismatches occur and all CAM double cells 90 in the row turn on at the same time, half of the cells, even cells 102, pull down ML, and half of the cells, odd cell 103, pull up MLB. This is ideal for supply bounce reduction, since half of the cells are pulling current from power, while the other half of the cells are pulling current from ground. The power and ground bounces tend to cancel out, reducing the net supply bounce. Less supply noise should occur.

Also, the capacitance of the ML line is reduced, since the number of transistor drains connected to match line ML is cut in half for the same number of stored bits of CAM double cell 90 compared with CAM cell 100. The lower capacitance of match line ML can result in faster discharging of the match line and a faster compare operation. The lower match-line capacitance can also allow for faster precharging, or for a smaller p-channel precharge transistor 122.

Ternary Content-Addressable Memory (TCAM)

Some search engines permit masking of some of the address bits during a search. For example, the network address stored in a row of CAM could have some lower address bits that are defined as don't care, or X, that match either a 0 or a 1 for the select line. A range of addresses applied to the select lines can match that single row entry in the CAM. For example, a network address of 101100001111XXXX matches 16 different addresses, from 1011000011110000 to 1011000011111111.

In CAM double cell 90, even cell 102 and odd cell 103 (FIG. 4) each store one binary bit, either 0 or 1. Ternary Content-Addressable Memory (TCAM) adds a third state, X, for a total of three possible states: 0, 1, X, for each address bit stored in the TCAM. Three logic states cannot be stored in one binary bit, so each TCAM cell has two cell latches that store 2 binary bits that encode the 3 states 0, 1, X. The fourth possible combination of the 2 binary bits is invalid, and the search engine or other logic can ensure that no CAM cell is written with this invalid combination of the 2 binary bits.

For example, each TCAM cell can have a first binary bit, F, and a second or Ternary bit, T. When T is 0 and F is 0, the state is invalid. External logic ensures that (T,F)=0,0 is never written into a TCAM cell. When T is 0 and F is 1, (0,1), the state is 0. When T is 1 and F is 0, (1,0), the state is 1. When T is 1 and F is 1, (1,1), the state is X, indicating that this bit is masked and will match either a 0 or a 1 on the select line.

Figure 7:
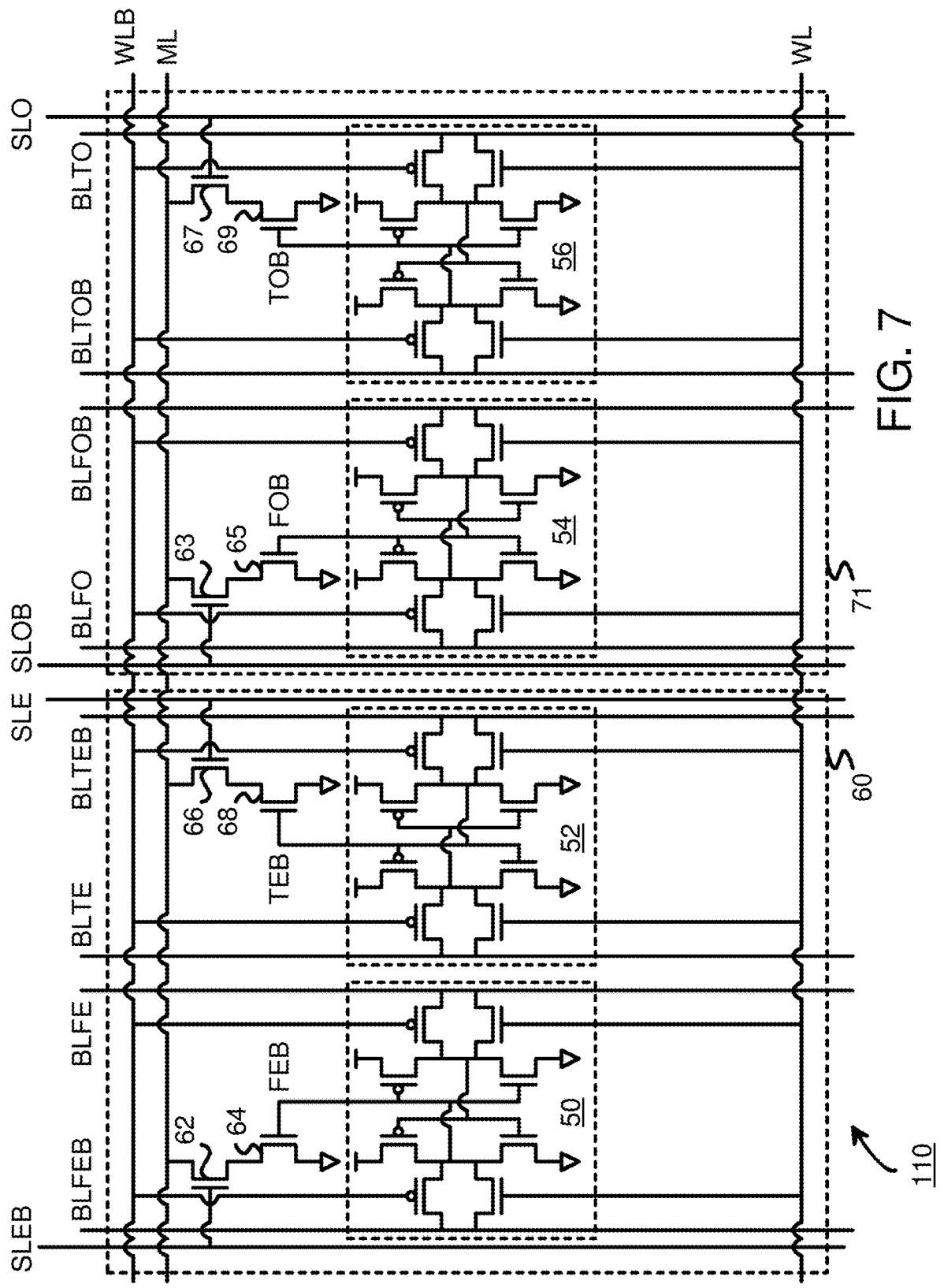
FIG. 7 is a schematic diagram of a Ternary Content-Addressable Memory (TCAM) double cell with a single match line.

FIG. 7 is a schematic diagram of a Ternary Content-Addressable Memory (TCAM) double cell with a single match line. TCAM double cell 110 includes even T-cell 60 that stores first even data bit FE in first latch 50 and ternary even bit TE in second latch 52. (FE,TE) identify the state of odd T-cell 71 as 0, 1, or X.

TCAM double cell 110 also includes odd T-cell 71 that stores first odd data bit FO in third latch 54 and ternary odd bit TO in fourth latch 56. (FO,TO) identify the state of even T-cell 60 as 0, 1, or X. (FE,TE) is independent of (FO,TO) and do not have any restrictions on each other. TCAM double cell 110 is able to store ternary data for two address bits in a network address that is being stored in a row in an array of TCAM double cell 110.

Each of latches 50, 52, 54, 56 have the same schematic as shown for latch 50 in FIG. 1. Each of latches 50, 52, 54, 56 has cross-coupled inverters of p-channel transistors 20, 22 and n-channel transistors 24, 26, and can store one binary bit. So a total of four binary bits, or two ternary values, are stored by the four latches 50, 52, 54, 56 of TCAM double cell 110.

Each of latches 50, 52, 54, 56 also has n-channel pass transistors 16, 18 and p-channel pass transistors 12, 14 as shown in FIG. 1. Each of latches 50, 52, 54, 56 is written or read through a pair of transmission gates, with one transmission gate having n-channel pass transistor 16 and p-channel pass transistor 12 to a true bit line, and another transmission gate having n-channel pass transistor 18 and p-channel pass transistor 14 to a complement bit line. The true bit line connects through the pass transistors to the true data node, while the complement bit line connects through the pass transistors to the inverse data node of the latch.

For example, in even T-cell 60, first latch 50 in the first column has pass transistors on the left that connect between complement bit line BLFEB and inverse data node FEB. First latch 50 also has pass transistors on the right that connect between true bit line BLFE and true data node FE (not labeled) that stores the first (FE) bit.

Second latch 52 in the second column has pass transistors on the right that connect between complement bit line BLTEB and inverse data node TEB. Second latch 52 also has pass transistors on the left that connect between true bit line BLTE and true data node TE (not labeled) that stores the ternary even (TE) bit.

In odd T-cell 71, third latch 54 in the third column has pass transistors on the right that connect between complement bit line BLFOB and inverse data node FOB. Third latch 54 also has pass transistors on the left that connect between true bit line BLFO and true data node FO (not labeled) that stores the first (FO) odd bit.

Fourth latch 56 in the fourth column has pass transistors on the left that connect between complement bit line BLTOB and inverse data node TOB. Fourth latch 56 also has pass transistors on the right that connect between true bit line BLTO and true data node TO (not labeled) that stores the ternary odd (TO) bit.

Each of latches 50, 52, 54, 56 has its inverse data node drive only one n-channel data transistor, which can pull match line ML low when the intervening n-channel select transistor is turned on by the select line connected to its gate. The true data node from latches 50, 52, 54, 56 do not connect to data transistors. Thus only one series of data and select transistors is provided for each of latches 50, 52, 54, 56.

For example, first latch 50 has inverse data node FEB drive the gate of n-channel data transistor 64, which is connected in series with n-channel select transistor 62 to match line ML. Complement even select line SLEB is driven to the gate of n-channel select transistor 62. When complement even select line SLEB is high and FEB is high, match line ML is driven low through transistors 62, 64. This is row 3, and the third of every 8 rows, in the truth table of FIGS. 11A-11B, where an unmasked data mismatch occurs with FE=0 and SLE=0. Masking only occurs when FE=1. A binary one is (T,F)=(1,0), which has F=0, while a binary zero is (T,F)=(0,1), which has F=1. Thus F is the inverse of the binary equivalent value.

Second latch 52 has inverse data node TEB drive the gate of n-channel data transistor 68, which is connected in series with n-channel select transistor 66 to match line ML. When even select line SLE is high and TEB is high, match line ML is driven low through transistors 66, 68. This is row 6, and the sixth of every 8 rows, in the truth table of FIGS. 11A-11B, where an unmasked data mismatch occurs with TE=0 and SLE=1. Masking only occurs when (T,F)=(1,1), so TEB=1 is not masked.

When the even bit is masked, then (T,F)=(1,1), and TEB=0, so n-channel data transistor 68 is off, and FEB=0, so n-channel data transistor 64 is off. Thus even T-cell 60 cannot pull match line ML low when the ternary bit stored is (1,1), regardless of the select line data.

For odd T-cell 71, third latch 54 has inverse data node FOB drive the gate of n-channel data transistor 65, which is connected in series with n-channel select transistor 63 to match line ML. When complement odd select line SLOB is high and FOB is high, match line ML is driven low through transistors 63, 65. This is rows 1-8 in the truth table of FIG. 11B, except that ML is driven to 0 rather than MLB driven to 1. This is an unmasked data mismatch between FO=0 and SLO=0.

Fourth latch 56 has inverse data node TOB drive the gate of n-channel data transistor 69, which is connected in series with n-channel select transistor 67 to match line ML. Odd select line SLO is connected to the gate of n-channel select transistor 67. When odd select line SLO is high and TOB is high, match line ML is driven low through transistors 67, 69. This is rows 17-24 in the truth table of FIG. 11A, except that ML is driven to 0 rather than MLB driven to 1. This is an unmasked data mismatch between TO=0 and SLO=1.

Rather than have one pair of select lines for each latch, such as for CAM double cell 90 (FIG. 4) or CAM cell 100 (FIG. 1), each pair of select lines is shared with two latches, or one ternary value. Each pair of select lines carries one binary bit, and that binary bit is compared with the ternary value. When the ternary value is X, or (T,F)=(1,1), then a match is indicated by floating the match line ML. Otherwise, the binary data on the select lines is compared to the equivalent binary value represented by the ternary value. A binary one is (T,F)=(1,0), which has F=0, while a binary zero is (T,F)=(0,1), which has F=1. Thus F is the inverse of the binary equivalent value.

Figure 8:
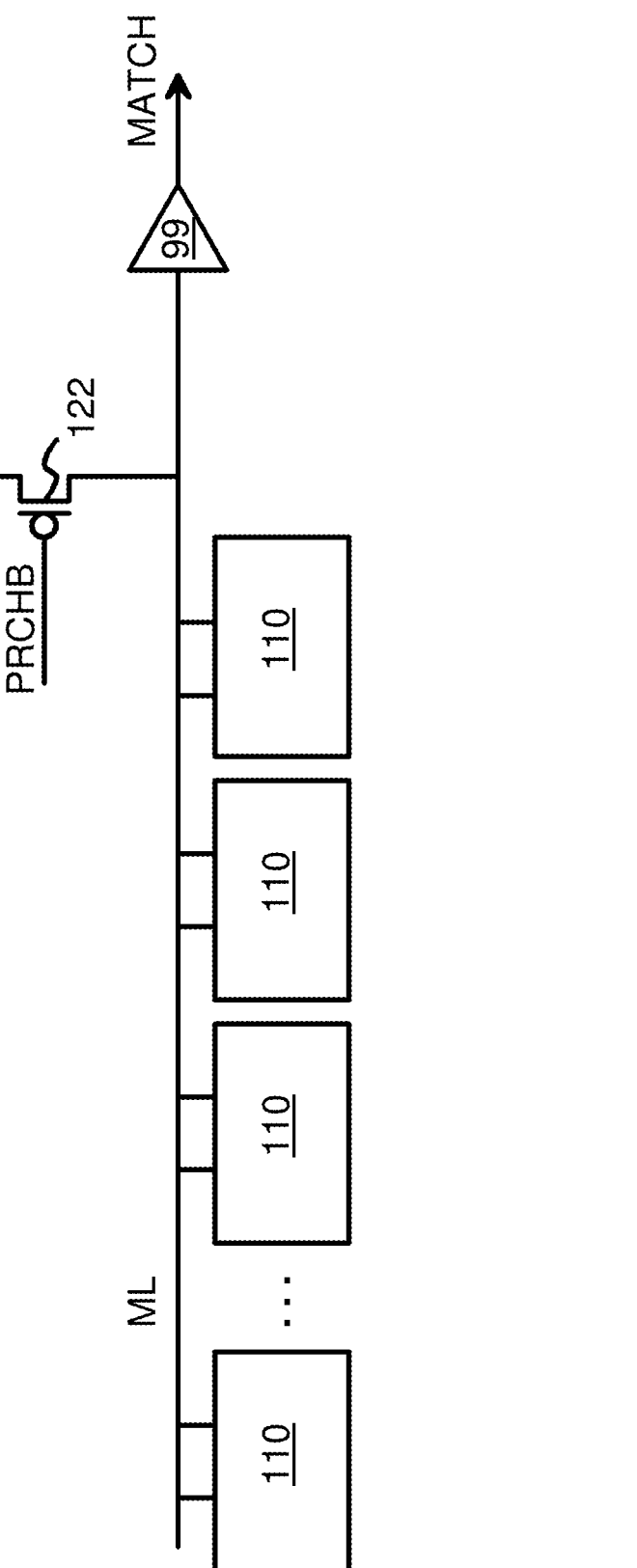
FIG. 8 shows a row of TCAM double cells.

FIG. 8 shows a row of TCAM double cells. A row of TCAM double cell 110 share the same write lines WL, WLB. Inside each TCAM double cell 110, even T-cell 60 and odd T-cell 71 each connect to match line ML.

Match line ML is precharged high by p-channel precharge transistor 122 when PRCHB is low before a compare operation. During the compare, PRCHB is driven high, turning off p-channel precharge transistor 122, allowing ML to float with a high initial state.

When all the TCAM double cells 110 in a row have even T-cell 60 and odd T-cell 71 match their even or odd select line data, then match line ML is not discharged and remains high. A logic one is applied to the input of driver 99, which drives match signal MATCH high to indicate that a match was found for this row. The TCAM array can report the row address for this matching row, or the data from this row can be read out and returned to the search engine.

When any of TCAM double cell 110 has an even T-cell 60 or an odd T-cell 71 that mis-matches the applied select data for that column, then that TCAM double cell 110 drives ML low. Driver 99 then drives match signal MATCH low to indicate that a match was not found for this row.

Figure 9:
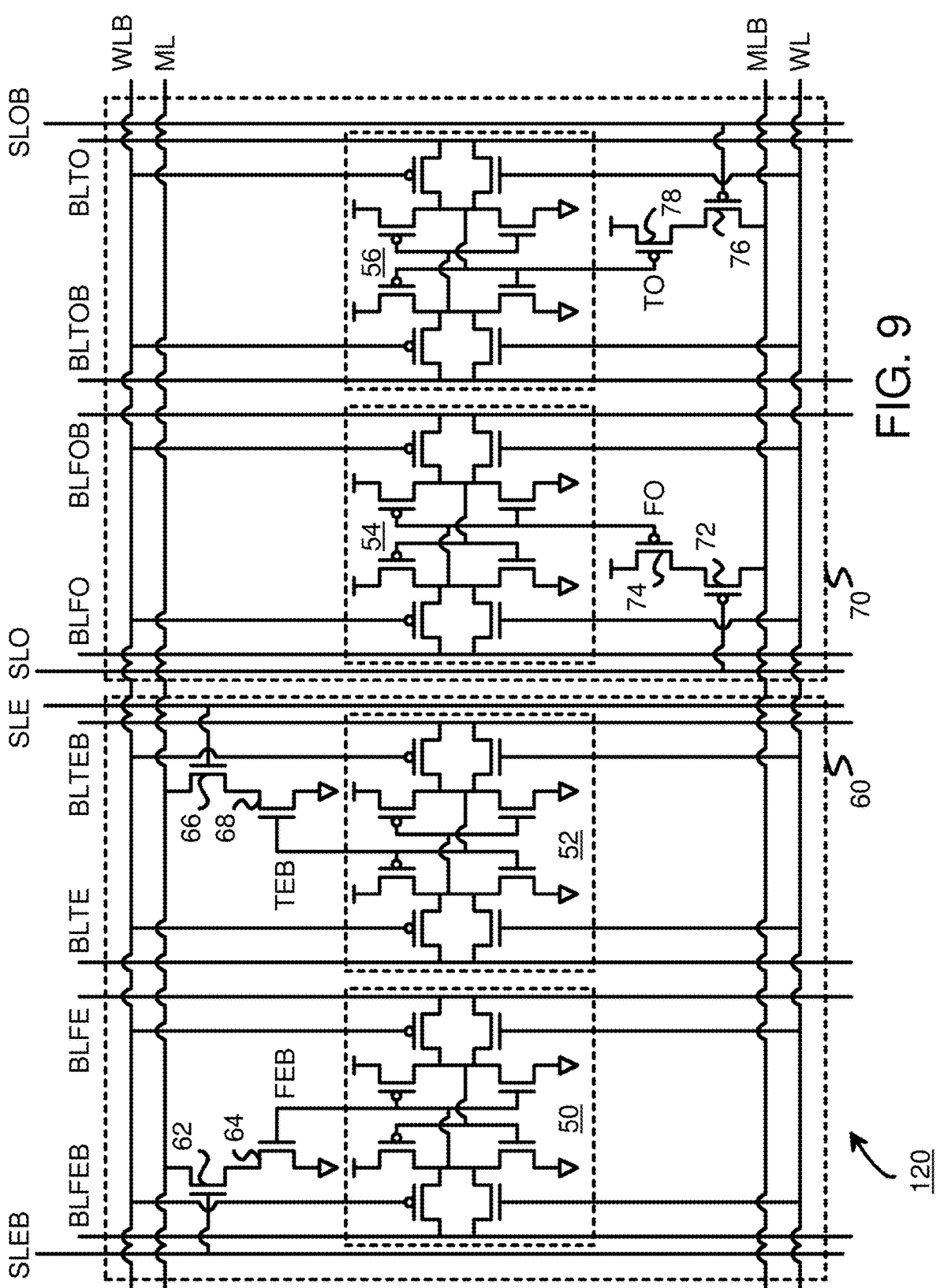
FIG. 9 is a schematic diagram of a Ternary Content-Addressable Memory (TCAM) double cell with complementary match lines.

FIG. 9 is a schematic diagram of a Ternary Content-Addressable Memory (TCAM) double cell with complementary match lines. TCAM double cell 120 includes even T-cell 60 and odd T-cell 70. Even T-cell 60 connects to match line ML while odd T-cell 70 connects to complement match line MLB. Even T-cell 60 is the same as described for FIG. 7, but odd T-cell 70 differs from odd T-cell 71. Latches 50, 52, 54, 56 are as described earlier for FIG. 7, each connecting to a pair of bit lines through transmission gates having both n-channel and p-channel pass transistors for low-impedance writing of the cell. The transmission gates provide a better noise margin and aid cell stability.

Even T-cell 60 has n-channel data transistors 64, 68 that have grounded sources, so match line ML is discharged to ground when both transistors 62, 64, or when both transistors 66, 68 turn on.

In contrast, odd T-cell 70 has p-channel data transistors 74, 78 that have sources connected to the power supply, such as VDD. Complement match line MLB is charged high to VDD through p-channel transistors 72, 74 or through p-channel transistors 76, 78.

In odd T-cell 70, p-channel select transistor 72 has a gate connected to odd select line SLO, while p-channel data transistor 74 has a gate driven by data node FO from third latch 54. transistors 72, 74 are in series between VDD and MLB. MLB is charged high when SLO=0 and FO=0 to indicate a mismatch.

This discharge of MLB to 0 corresponds to rows 1-8 of the truth table of FIG. 11B. This is an unmasked data mismatch between FO=0 and SLO=0.

Fourth latch 56 has data node TO drive the gate of p-channel data transistor 78, which is connected in series with p-channel select transistor 76 to complement match line MLB. Complement odd select line SLOB is connected to the gate of p-channel select transistor 76. When complement odd select line SLOB is low and TO is low, complement match line MLB is driven high through transistors 76, 78. This is rows 17-24 in the truth table of FIG. 11A. This is an unmasked data mismatch between TO=0 and SLO=1.

Rather than have one pair of select lines for each latch, such as for CAM double cell 90 (FIG. 4) or CAM cell 100 (FIG. 1), each pair of select lines is shared with two latches, or one ternary value.

TCAM double cell 120 of FIG. 9 is a 40T cell with 20 p-channel transistors and 20 n-channel transistors. TCAM double cell 120 has a 50:50 PMOS:NMOS ratio, which is ideal for efficient layout in macro cell libraries. During compare operations, when mismatches occur and all TCAM double cells 120 in the row turn on at the same time, half of the cells, even T-cell 60, pull down ML, and half of the cells, odd T-cell 70, pull up MLB. This is ideal for supply bounce reduction, since half of the cells are pulling current from power, while the other half of the cells are pulling current from ground. The power and ground bounces tend to cancel out, reducing the net supply bounce. Less supply noise should occur.

Also, the capacitance of match line ML line is reduced, since the number of transistor drains connected to match line ML is cut in half for the same number of stored bits of TCAM double cell 120 compared with TCAM cell 110 (FIG. 7). The lower capacitance of match line ML can result in faster discharging of the match line and a faster compare operation. The lower match-line capacitance can also allow for faster precharging, or for a smaller p-channel precharge transistor 122.

Figure 10:
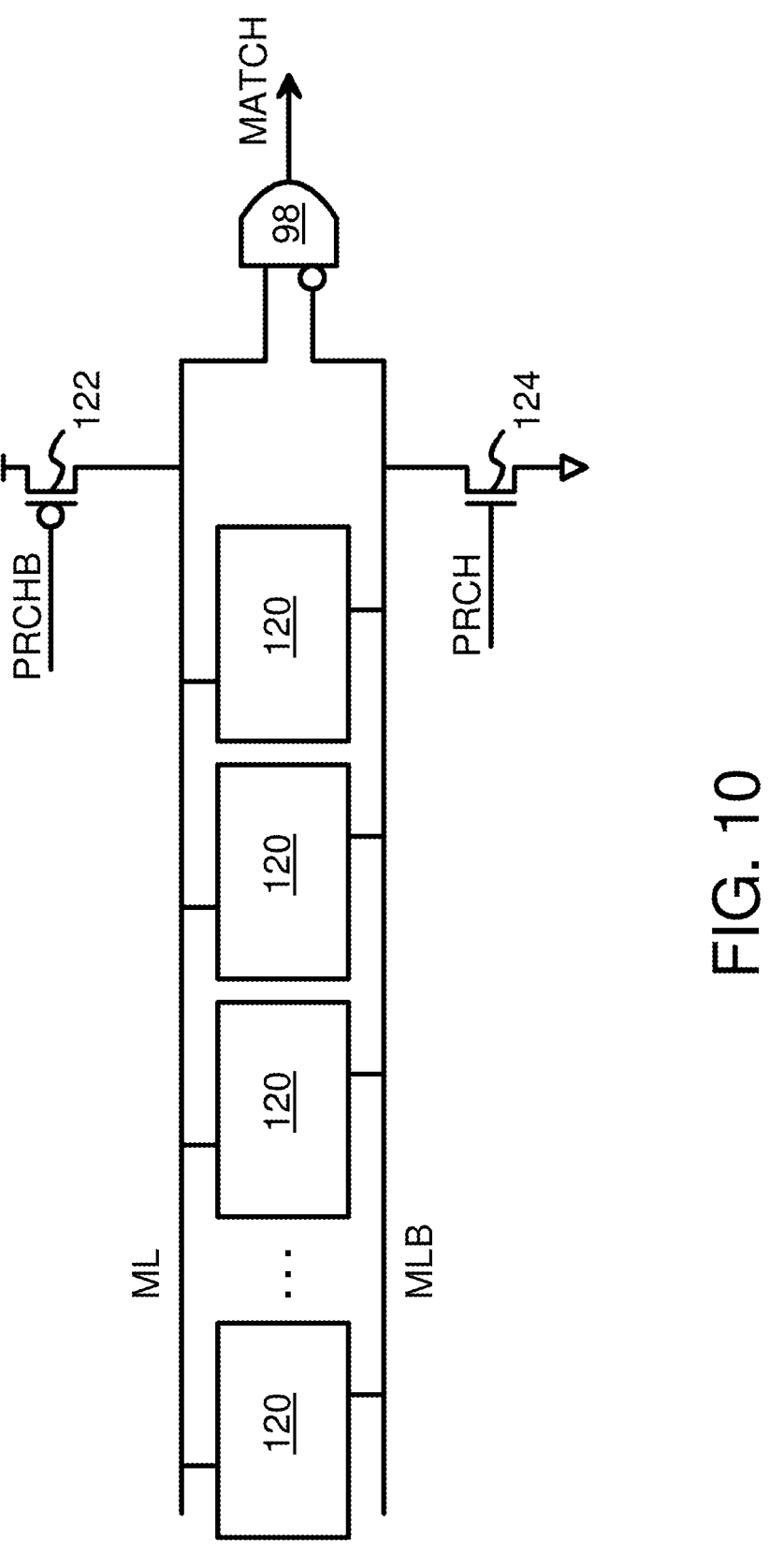
FIG. 10 shows a row of TCAM double cells with complementary match lines.

FIG. 10 shows a row of TCAM double cells with complementary match lines. A row of TCAM double cell 120 share the same write lines WL, WLB. Inside each TCAM double cell 120, even T-cell 60 connects to match line ML while odd T-cell 70 connects to complement match line MLB.

Match line ML is precharged high by p-channel precharge transistor 122 when PRCHB is low before a compare operation. During the compare, PRCHB is driven high, turning off p-channel precharge transistor 122, allowing ML to float with a high initial state.

Complement match line MLB is precharged low by n-channel precharge transistor 124 when PRCH is high before a compare operation. During the compare, PRCH is driven low, turning off n-channel precharge transistor 124, allowing MLB to float with a low initial state.

When all the TCAM double cells 120 in a row have even T-cell 60 match their even select line data, then match line ML is not discharged and remains high. A logic one is applied to the upper input of gate 98. When all the TCAM double cell 120 in a row have their odd T-cell 70 match their odd select line data, then complement match line MLB is not charged and remains low. A logic zero is applied to the lower input of gate 98. When ML remains high and MLB remains low, gate 98 drives match signal MATCH high to indicate that a match was found for this row. The TCAM array can report the row address for this matching row, or the data from this row can be read out and returned to the search engine.

When any of TCAM double cell 120 has an even T-cell 60 that mis-matches the applied even select data for that column, then that TCAM double cell 120 drives ML low. Gate 98 then drives match signal MATCH low to indicate that a match was not found for this row. When any of TCAM double cell 120 has an odd T-cell 70 that mis-matches the applied odd select data for that column, then that TCAM double cell 120 drives MLB high. Gate 98 then drives match signal MATCH low to indicate that a match was not found for this row. Thus both even and odd cells in the entire row must match all select bits applied to the row for a final MATCH to be signaled.

FIGS. 11A-11B show a truth table for the TCAM double cell of FIG. 9. FEB is the inverse of even first bit FE stored in first latch 50 of even T-cell 60, while TEB is the inverse of even Ternary bit TE stored in second latch 52 of even T-cell 60. SLEB is the inverse of SLE, which is the even select line applied to a column of even T-cell 60.

FOB is the inverse of odd first bit FO stored in third latch 54 of odd T-cell 70, while TOB is the inverse of odd Ternary bit TO stored in fourth latch 56 of odd T-cell 70. SLOB is the inverse of SLO, which is the odd select line applied to a column of odd T-cell 70.

There are 48 possible combinations of FE, TE, SLE, FO, TO, SLO shown in the table. However, some combinations are invalid, such as for (TE,FE)=(0,0), as shown in rows 1, 5, and every first and fifth row for every group of 8 rows. Also, the first 8 rows are invalid because (TO,FO)=(0,0).

Masking of even T-cell 60 occurs when (TE,FE)=(1,1), shown in every fourth and eight rows. Masking of odd T-cell 70 occurs when (TO,FO)=(1,1), shown in the last 8 rows of FIG. 11B. When both even T-cell 60 and odd T-cell 70 are masked, then MATCH is driven high, as shown in the last and fourth from the last rows of FIG. 11B. When masked, the select lines can be either 0 or 1, and are shown as X in the table even though the actual select line is either 0 or 1.

A final MATCH=1 occurs when both ML=1 and MLB=0, which are the precharged or initial values that are not pulled low or high by the select and data transistors in TCAM double cell 120. For example, the tenth row in FIG. 11A is a MATCH with (TE,FE)=(0,1), which is defined as a data 0, which matches select line SLE=0. Also row 15 is a MATCH with (TE,FE)=(1,0), which is defined as a data 1, which matches select line SLE=1. Both of these rows have (TO, FO)=(0,1), which is defined as a data 0, which matches select line SLO=0 applied to odd T-cell 70

FE changes for each row in the truth table, TE changes for every 2 rows, SLE changes for every 4 rows, for even T-cell 60. For odd T-cell 70, SLO changes for each 8 rows in the truth table, TO changes for every 16 rows, and FO changes for every 16 rows with a staggered start.

ALTERNATE EMBODIMENTS

Several other embodiments are contemplated by the inventors. Using both n-channel and p-channel transistors in parallel from the bit lines to the cell latch allows a CAM/TCAM cell and its macro architecture to have deep dynamic voltage and power scaling in advanced node FinFet/GAA technologies. Only a single power supply is required for a wide range of Process, supply Voltage, Temperature (PVT) conditions. Power consumption reduction of 10× may be achieved by a combination of a reduced power supply voltage and lowered operating clock frequency. In an asynchronous read cell/macro variety the address alignment with a clock is not required for a high-speed access. The CAM cell could be expanded by adding 1, 2, 3, or more additional read ports or compare ports. Layout footprint is minimized for advanced node CMOS technologies because NMOS and PMOS transistor counts are balanced in the memory cells.

While the source of n-channel data transistor 44 has been described as being grounded while the drain of n-channel select transistor 42 has been described as being connected to match line ML, the order of these transistors in series may be reversed. While the channels of transistors 42, 44 are in series, the order is not critical. Ground could connect to the source of n-channel select transistor 42, which has a drain connected to the source of n-channel data transistor 44, which has its drain connected to match line ML. Other select and data transistors could likewise be re-ordered while still being in series between a supply and a match line.

CAM double cell 90 can be arrayed with as many rows and columns as needed for a particular application. For example, a network lookup table may store a 64-bit address in each row, and has a capacity to store 1024 addresses. CAM double cell 90 could be arrayed into 1024 rows and 32 columns for a total memory size of 1024×64 bits. TCAM double cell 110, TCAM double cell 120, or other variations could similarly be arrayed as desired.

In some embodiments, both WL, WLB are activated for write operations, but only word line WL is activated during a read operation, not WLB. In this variation, p-channel pass transistors 12, 14, only turn on during a valid write operation and remain off during reads to isolate the cell latch inside the CAM/TCAM cell. Reading is done through n-channel pass transistors 16, 18.

There may be additional data stored in a SRAM that is accessed when a match is found in the CAM array. For example, a network address may be stored in a row in the CAM, while attributes or meta data may be stored for this row in a SRAM. When the CAM row matches, the meta data stored in the SRAM may be read and returned with the matching network address stored in the CAM for that row.

Memory cells, muxes, decoders, latches, precharge circuits may all use a single power supply, VDD. VDD is also used for all logic cells in the standard cell library. Latches provide the necessary setup and hold times.

Compare operations could be performed in parallel on all rows at the same time by activating all word lines to compare to the same select line data. Search engine logic could then examine the MATCH result for each row and return the row address or other row identifier of any matches found.

In some cases more than one row will match, and all matching row addresses can be returned, or only one of the matching row addresses returned. Each row can have its own gate 98 or driver 99 similar logic, or this logic could be shared among rows when serial compare operations are performed on only one row at a time.

A CAM array could have a mixture of CAM cells and TCAM cells. For example, the search engine could allow for masking of only lower address bits, and not allow any masking of upper address bits in a network address. Each row could have CAM cells for the upper address bits, and TCAM cells for the lower address bits that can be masked. The row could also contain SRAM cells that store meta data that is not compared.

While a particular encoding of the ternary state has been described, other encodings could be substituted, with adjustments to the compare logic implemented by the select and data transistors.

While cells with pull-up p-channel transistors 20, 22 in the cell latch have been described, pull-up resistors could replace p-channel transistors 20, 22. Various layouts of the CAM/TCAM cell are possible.

While operation of the CAM and TCAM cells has been described, various modifications can be made. The sense amplifier could be inverted and sense high-going rather than low-going bit lines. A simplified sense amplifier such as a single-ended sense buffer could be used. Using a simple single-ended sense amplifier can reduce costs for applications that do not have a strict timing requirement. A differential sense amplifier can provide faster reading if needed by the application.

Address inputs, timing signal inputs and other inputs such as for power down or de-selection could be combined by logic within the decoders and other logic upstream to the final inverting buffers. A controller could generate various timing signals from a clock or an access request signal to obtain desired waveforms. Some memory architectures may not use row and column decoders of an address.

Various architectures can be employed, such as a standard array of rows and columns, a folded bit line architecture, sub-array architectures, split rows or split columns, dummy rows or dummy columns, etc. Columns or rows may be split or fold over such as where two physical columns have their bit lines connected together as a single column from a schematic viewpoint. Arbitrary memory sizes M×N and word lengths Q can be supported. Multiple arrays or sub-arrays may be employed.

Various signals could be inverted. For example, the bit lines could be reset low rather than precharged high. The pre-initialized bit lines could be driven high by the selected cell rather than driven low. P-channel and n-channel transistors could be swapped. Inversions could be added or removed at various places, such as by swapping or crossing true and complement bit lines and select lines, or adding or removing inverters or using non-inverting rather than inverting buffers.

The ground connection to the memory cells could connect to a back-bias generator that generates a body or bias voltage that is below ground. The muxing of columns may be much more complex, and there may be sub-arrays and selections of one sub-array and disabling of other sub-arrays. Masking logic may be added that could disable sensing or writing of certain bits within a multi-bit word.

The actual margin values, and the power supply VDD voltages can vary. Supply voltages can be scaled with process improvements and may be dynamically adjusted or switched in a system, such as to reduce over-heating when a temperature alarm is signaled, or when the system enters a low-power mode. A voltage regulator or filter might be added to VDD, or the natural capacitances of the memory cells may be sufficient to regulate VDD.

Many layouts of the cell are possible within the spirit of the invention, and those skilled in the art will be able to make many modifications. In particular, CAM double cell 90 and TCAM double cell 110 may be mirrored in layout when arrayed.

The n-channel access transistor can have a source diffusion connected to the bit line and a drain diffusion connected to the cross-coupled inverters. However, those skilled in the art will recognize that MOS transistors are bi-directional in nature and the source and drain diffusions are physically indistinguishable. For normal bit-line biasing, the source terminal of an n-channel transistor has a lower voltage or potential than the drain terminal, but if the applied voltage is reversed then the source and drain terminals can reverse with the drain becoming the source and vice-versa. Thus the terms "source" and "drain" are used interchangeably, and for both p-channel and n-channel transistors.

Additional leaker devices such as resistors and small transistors could be added. Parasitic capacitances and resistances may be used from some components, depending on the process and device sizes used. Bias, VDD, and voltage values may vary somewhat due to process, temperature, and design variances.

While descriptions of current flows and operations have been presented, these are theoretical, and the theories may be incomplete or even incorrect. Especially for small devices, currents may flow in unusual ways and using mechanisms that have not yet been thoroughly researched and understood. Second and third order effects may also be present.

Cutouts in diffusion and other regions may be used. Other shapes and physical layouts may be substituted, such as intermingled fingers. For FinFET transistors, fins could intersect other fins, bend, or have various macro geometries and layouts. Dummy FinFet devices could be added as desired for a specific process technology.

Devices may be implemented using n-channel, p-channel, or bipolar transistors, or junctions within these transistors, or carbon nanotubes. A capacitor could be attached to a resistance to provide an R-C time delay, or more complex circuits such as active triggering circuits may be added. In some embodiments, high-voltage transistors may be used rather than low-voltage transistors with appropriate bias conditions. The gate lengths and spacings can be increased to provide better protection from damage.

Different transistor, capacitor, resistor, and other device sizes can be used, and various layout arrangements can be used, such as multi-leg, ring, doughnut or irregular-shape transistors. Additional taps, guard rings, transistors, and other components may be added. More than one power supply may be used.

The background of the invention section may contain background information about the problem or environment of the invention rather than describing prior art by others. Thus, inclusion of material in the background section is not an admission of prior art by the Applicant.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A Content-Addressable Memory (CAM) cell comprising:

a first pull-up transistor and a first pull-down transistor connected in series between a power supply and a ground, the first pull-up transistor and the first pull-down transistor connected at a first latch node;

a second pull-up transistor and a second pull-down transistor connected in series between the power supply and the ground, the second pull-up transistor and the second pull-down transistor connected at a second latch node;

wherein gates of the first pull-up transistor and of the first pull-down transistor are driven by the second latch node between the second pull-up transistor and the second pull-down transistor;

wherein gates of the second pull-up transistor and of the second pull-down transistor are driven by the first latch node between the first pull-up transistor and the first pull-down transistor;

a first n-channel pass transistor connected between the first latch node and a first bit line, and having a gate connected to a word line;

a second n-channel pass transistor connected between the second latch node and a second bit line, and having a gate connected to the word line;

a first p-channel pass transistor connected between the first latch node and the first bit line, and having a gate connected to an inverse word line;

a second p-channel pass transistor connected between the second latch node and the second bit line, and having a gate connected to the inverse word line;

a first data transistor with a gate connected to the second latch node, and a channel that conducts current controlled by the gate to a first connecting node; and a first select transistor having a gate connected to a first select line and a channel connected between the first connecting node and a match line;

wherein the match line is perpendicular to the first select line, wherein the match line connects to other CAM cells in a row and the first select line connects to other CAM cells in a column of an array of the CAM cells arrayed into rows and columns, a second data transistor with a gate connected to the first latch node, and a channel that conducts current controlled by the gate to a second connecting node; and a second select transistor having a gate connected to a second select line and a channel connected between the second connecting node and the match line;

wherein a compare operation is performed by applying a compare bit from compare data to the second select line, and by applying an inverse of the compare bit to the first select line; wherein when the compare bit mismatches data stored in the CAM cell the match line is discharged through the first select transistor and the first data transistor, or is discharged through the second select transistor and the second data transistor, wherein for cells in even columns;

the first data transistor and the second data transistor each further comprises an n-channel transistor having a source connected to the ground;

the first select transistor and the second select transistor each further comprises an n-channel transistor;

the match line further comprises a true match line that is precharged high before the compare operation and is discharged low when a mismatch occurs in an even column;

wherein for cells in odd columns;

the first data transistor comprises a p-channel transistor with a source connected to the power supply;

the second data transistor comprises a p-channel transistor with a source connected to the power supply;

the first select transistor and the second select transistor each comprise a p-channel transistor;

the match line is a complement match line that is precharged low before the compare operation and is discharged high when a mismatch occurs in an odd column;

further comprising, for a row of the CAM cell;

a true precharge transistor that precharges the true match line high before the compare operation;

a complement precharge transistor that precharges the complement match line low before the compare operation; and match logic that signals a match for the row of the CAM cell when the true match line remains high and the complement match line remains low during the compare operation, wherein a total number of n-channel transistors equals a total number of p-channel transistors in a pair of the CAM cell, the pair including a CAM cell in the even columns and a CAM cell in the odd columns, whereby the CAM cell is P/N balanced over a pair of odd and even columns.

2. The CAM cell of claim 1 wherein the power supply further comprises a logic power supply that is used to power logic gates external to the CAM cell.

3. A Content-Addressable Memory (CAM) cell comprising:

a first pull-up transistor and a first pull-down transistor connected in series between a power supply and a ground, the first pull-up transistor and the first pull-down transistor connected at a first latch node;

a second pull-up transistor and a second pull-down transistor connected in series between the power supply and the ground, the second pull-up transistor and the second pull-down transistor connected at a second latch node;

wherein gates of the first pull-up transistor and of the first pull-down transistor are driven by the second latch node between the second pull-up transistor and the second pull-down transistor;

wherein gates of the second pull-up transistor and of the second pull-down transistor are driven by the first latch node between the first pull-up transistor and the first pull-down transistor;

a first n-channel pass transistor connected between the first latch node and a first bit line, and having a gate connected to a word line;

a second n-channel pass transistor connected between the second latch node and a second bit line, and having a gate connected to the word line;

a first p-channel pass transistor connected between the first latch node and the first bit line, and having a gate connected to an inverse word line;

a second p-channel pass transistor connected between the second latch node and the second bit line, and having a gate connected to the inverse word line;

a first data transistor with a gate connected to the second latch node, and a channel that conducts current controlled by the gate to a first connecting node; and a first select transistor having a gate connected to a first select line and a channel connected between the first connecting node and a match line;

wherein the match line is perpendicular to the first select line, wherein the match line connects to other CAM cells in a row and the first select line connects to other CAM cells in a column of an array of the CAM cells arrayed into rows and columns, further comprising a Ternary Content-Addressable Memory (TCAM) cell that further comprises;

a ternary first pull-up transistor and a ternary first pull-down transistor connected in series between the power supply and the ground, the ternary first pull-up transistor and the ternary first pull-down transistor connected at a ternary first latch node;

a ternary second pull-up transistor and a ternary second pull-down transistor connected in series between the power supply and the ground, the ternary second pull-up transistor and the ternary second pull-down transistor connected at a ternary second latch node;

wherein gates of the ternary first pull-up transistor and of the ternary first pull-down transistor are driven by the ternary second latch node between the ternary second pull-up transistor and the ternary second pull-down transistor;

wherein gates of the ternary second pull-up transistor and of the ternary second pull-down transistor are driven by the ternary first latch node between the ternary first pull-up transistor and the ternary first pull-down transistor;

a ternary first n-channel pass transistor connected between the ternary first latch node and a ternary first bit line, and having a gate connected to the word line;

a ternary second n-channel pass transistor connected between the ternary second latch node and a ternary second bit line, and having a gate connected to the word line;

a first p-channel pass transistor connected between the ternary first latch node and the ternary first bit line, and having a gate connected to the inverse word line;

a ternary second p-channel pass transistor connected between the ternary second latch node and the ternary second bit line, and having a g rate connected to the inverse word line;

a ternary first data transistor with a gate connected to the ternary second latch node, and a channel that conducts current controlled by the gate to a ternary first connecting node; and a ternary first select transistor having a gate connected to a ternary first select line and a channel connected between the ternary first connecting node and the match line, wherein a compare operation is performed by applying a compare bit from compare data to the ternary first select line, and by applying an inverse of the e compare bit to the first select line; wherein when the compare bit mismatches data stored in the TCAM cell the match line is discharged through the first select transistor and the first data transistor, or is discharged through the ternary first select transistor and the ternary first data transistor, wherein for cells in even columns;

the first data transistor and the ternary first data transistor each further comprises an n-channel transistor having a source connected to the ground;

the first select transistor and the ternary first select transistor each further comprises an n-channel transistor;

the match line further comprises a true match line that is precharged high before the compare operation and is discharged low when a mismatch occurs in an even column;

wherein for cells in odd columns;

the first data transistor comprises a p-channel transistor with a source connected to the power supply;

the ternary first data transistor comprises a p-channel transistor with a source connected to the power supply;

the first select transistor and the ternary first select transistor each comprise a p-channel transistor;

the match line is a complement match line that is precharged low before the compare operation and is discharged high when a mismatch occurs in an odd column;

further comprising, for a row of the TCAM cell;

a true precharge transistor that precharges the true match line high before the compare operation;

a complement precharge transistor that precharges the complement match line low before the compare operation;

match logic that signals a match for the row of the TCAM cell when the true match line remains high and the complement match line remains low during the compare operation, wherein a total number of n-channel transistors equals a total number of p-channel transistors in a pair of the CAM cell, the pair including a CAM cell in the even columns and a CAM cell in the odd columns, whereby the pair of the CAM cell is P/N balanced.

* * * * *